(12) United States Patent
Tan et al.

(10) Patent No.: US 11,803,125 B2
(45) Date of Patent: Oct. 31, 2023

(54) METHOD OF FORMING A PATTERNED STRUCTURE AND DEVICE THEREOF

(71) Applicant: Singapore University of Technology and Design, Singapore (SG)

(72) Inventors: You Sin Tan, Singapore (SG); Joel Yang, Singapore (SG); Hailong Liu, Singapore (SG); Qifeng Ruan, Singapore (SG)

(73) Assignee: Singapore University of Technology and Design, Singapore (SG)

( * ) Notice: Subject to any disclaimer, the term of this patent is extended or adjusted under 35 U.S.C. 154(b) by 302 days.

(21) Appl. No.: 16/919,227

(22) Filed: Jul. 2, 2020

(65) Prior Publication Data
US 2021/0405532 A1 Dec. 30, 2021

(30) Foreign Application Priority Data

Jun. 25, 2020 (SG) .............................. 10202006116P

(51) Int. Cl.
*G03F 7/20* (2006.01)
*G03F 7/38* (2006.01)
(Continued)

(52) U.S. Cl.
CPC ............ *G03F 7/2037* (2013.01); *G03F 7/038* (2013.01); *G03F 7/0755* (2013.01); *G03F 7/162* (2013.01);
(Continued)

(58) Field of Classification Search
CPC .... G03F 7/2037; G03F 7/2059; G03F 7/2065; G03F 7/2022; G03F 7/38
See application file for complete search history.

(56) References Cited

U.S. PATENT DOCUMENTS

2004/0132291 A1* 7/2004 Lee ................... H01L 21/76808
438/689
2007/0048790 A1* 3/2007 Sheetz ................... B82Y 15/00
435/7.1
(Continued)

FOREIGN PATENT DOCUMENTS

CN 103359683 A 10/2013
CN 105217561 A 1/2016
(Continued)

OTHER PUBLICATIONS

Tennant, D. M., "Limits of Conventional Lithography", Nanotechnology, Jan. 1999, pp. 161-205, Springer-Verlag New York, Inc.
(Continued)

*Primary Examiner* — Daborah Chacko-Davis

(57) ABSTRACT

There is provided a method of forming a patterned structure on a substrate. The method includes: forming a resist layer on the substrate, the resist layer being a negative tone resist; exposing a first portion of the resist layer to a focused electron beam to form a modified first portion, the modified first portion defining a boundary of a second portion of the resist layer; performing a plasma treatment on a surface of the resist layer, including on a surface of the second portion of the resist layer to form a modified surface portion of the second portion of the resist layer, resulting in a plasma treated resist layer; and performing development of the plasma treated resist layer to form the patterned structure on the substrate corresponding the second portion of the resist layer.

15 Claims, 14 Drawing Sheets

(51) Int. Cl.
  H01L 21/027 (2006.01)
  G03F 7/16 (2006.01)
  G03F 7/075 (2006.01)
  G03F 7/32 (2006.01)
  G03F 7/038 (2006.01)
(52) U.S. Cl.
  CPC ............ *G03F 7/2022* (2013.01); *G03F 7/322* (2013.01); *G03F 7/38* (2013.01); *H01L 21/0274* (2013.01)

(56) References Cited

U.S. PATENT DOCUMENTS

| | | |
|---|---|---|
| 2013/0201467 A1 | 8/2013 | Manakli |
| 2015/0255298 A1 | 9/2015 | Darling et al. |
| 2017/0077036 A1 | 3/2017 | Chang et al. |

FOREIGN PATENT DOCUMENTS

| | | |
|---|---|---|
| CN | 106169416 A | 11/2016 |
| JP | 2016171309 A | 9/2016 |

OTHER PUBLICATIONS

Vieu, C. et al., "Electron beam lithography: resolution limits and applications", Applied Surface Science, Sep. 2000, pp. 111-117, Elsevier Science B.V.

Yang, Joel K. W et al., "Understanding of hydrogen silsesquioxane electron resist for sub-5-nm-half-pitch lithography", Journal of Vacuum Science & Technology B: Microelectronics and Nanometer Structures Processing, Measurement, and Phenomena, 2009, pp. 2622-2627, American Institute of Physics.

Cord, Bryan et al., "Limiting factors in sub-10nm scanning-electron-beam lithography", Journal of Vacuum Science & Technology B: Microelectronics and Nanometer Structures Processing, Measurement, and Phenomena, 2009, pp. 2616-2621, American Institute of Physics.

Duan, Huigao et al., "Metrology for electron-beam lithography and resist contrast at the sub-10 nm scale", Journal of Vacuum Science & Technology B 28, Nov. 2010, pp. C6H11-C6H17.

Manfrinato, Vitor R. et al., "Resolution Limits of Electron-Beam Lithography toward the Atomic Scale", Nano Letters, pp. 1555-1558, Mar. 2013, American Chemical Society (ACS).

Chang, T. H. P., "Proximity effect in electron-beam lithography", Journal of Vacuum Science and Technology, 1975, pp. 1271-1275.

Chen, Yiqin et al., ""Sketch and Peel" Lithography for High-Resolution Multiscale Patterning", Nano Letters 16 (5), pp. 3253-3259, Apr. 2016.

Todeschini, Matteo et al., "Influence of Ti and Cr Adhesion Layers on Ultrathin Au Films", ACS Applied Materials & Interfaces 9 (42), Oct. 2017, pp. 37374-37385.

Hughes, John F. et al., "Computer Graphics: Principles and Practice", Third Edition, Addison-Wesley, Jul. 2013, 1263 pages.

Namatsu, Hideo et al., "Three-dimensional siloxane resist for the formation of nanopatterns with minimum linewidth fluctuations", Journal of Vacuum Science & Technology B: Microelectronics and Nanometer Structures Processing, Measurement, and Phenomena 16, Jun. 1998, pp. 69-76, American Institute of Physics.

Yang, Joel K. W. et al., "Using high-contrast salty development of hydrogen silsesquioxane for sub-10-nm half-pitch lithography", Journal of Vacuum Science & Technology B: Microelectronics and Nanometer Structures Processing, Measurement, and Phenomena 25, Dec. 2007, pp. 2024-2029.

Namatsu, H. et al., "Nano-Patterning of a Hydrogen Silsesquioxane Resist with Reduced Linewidth Fluctuations", Microelectronic Engineering, Mar. 1998, pp. , vol. 41-42.

Yang, Joel K. W. et al., "Fabrication Development for Nanowire GHz-Counting-Rate Single-Photon Detectors", Jun. 2005, pp. 626-630, IEEE Transactions on Applied Superconductivity, vol. 15, Issue 2.

Kumar, Karthik et al., "Printing colour at the optical diffraction limit", Sep. 2012, pp. 557-561, Nature Nanotechnology, vol. 7.

Gnan, M. et al., "Fabrication of low-loss photonic wires in silicon-on-insulator using hydrogen silsesquioxane electron-beam resist", Jan. 2008, pp. 115-116, Electronics Letters, vol. 44, Issue 2.

Kawamori, Masanori et al., "Effect of Oxygen Plasma Irradiation on Hydrogen Silsesquioxane Nanopatterns Replicated by Room-Temperature Nanoimprinting", Japanese Journal of Applied Physics 45(11), Nov. 2006, pp. 8994-8996.

Yang, Joel K. W. et al., "Enhancing etch resistance of hydrogen silsesquioxane via post developelectron curing", Journal of Vacuum Science & Technology B: Microelectronics and Nanometer Structures Processing, Measurement, and Phenomena 24, Nov. 2006, pp. 3157-3161.

Matsui, S. et al., "Room Temperature Nanoimprint Technology Using Hydrogen Silsequioxane (HSQ)", Journal of Vacuum Science & Technology B: Microelectronics and Nanometer Structures Processing, Measurement, and Phenomena, 2003, pp. 688-692, vol. 21, Issue 2.

Chou, Stephen Y. et al., "Nanoimprint lithography", Japanese Journal of Applied Physics B 14(6), Apr. 1996, pp. 4129-4133, American Vacuum Society.

Morecroft, Debbie et al., "Sub-15nm nanoimprint molds and pattern transfer", Journal of Vacuum Science & Technology B: Microelectronics and Nanometer Structures Processing, Measurement, and Phenomena 27, Dec. 2009, pp. 2837-2840, American Institute of Physics.

Peroz, C. et al., "Single digit nanofabrication by step-and-repeat nanoimprint lithography", Dec. 2011, 6 pages, Nanotechnology, vol. 23, No. 1.

Choi, Sookyung et al., "Comparative study of thermally cured and electron-beam-exposed hydrogen silsesquioxane resists", Journal of Vacuum Science & Technology B: Microelectronics and Nanometer Structures Processing, Measurement, and Phenomena 26, Sep. 2008, pp. 1654-1659.

Yang, Chang-Chung et al., "The structures and properties of hydrogen silsesquioxane (HSQ) films produced by thermal curing", Journal of Materials Chemistry 12 (4), Mar. 2002, pp. 1138-1141.

Namatsu, Hideo, "On the Mechanism of Plasma Oxidation of Polysiloxane", Journal of The Electrochemical Society, Sep. 1989, pp. 2676-2680, vol. 136, No. 9.

Singh, Sunil Kumar et al., "Resisting oxygen plasma damage in low-k hydrogen silsesquioxane films by hydrogen plasma treatment", Material Letters 60 (13), Jun. 2006, pp. 1579-1581.

Qianghua, Yuan et al., "Effect of Oxygen Plasma on Low Dielectric Constant HSQ (Hydrogensilsesquioxane) Films", Plasma Science and Technology 15 (1), Jan. 2013, pp. 86-88.

Liu, P. T. et al., "The effects of plasma treatment for low dielectric constant hydrogen silsesquioxane (HSQ)", Thin Solid Films, Nov. 1998, pp. 1-466, vol. 332, Issue 1-2.

Nam, Sung-Wook et al., "Contrast enhancement behavior of hydrogen silsesquioxane in a salty developer", Journal of Vacuum Science & Technology B: Microelectronics and Nanometer Structures Processing, Measurement, and Phenomena B 27 (6), Nov. 2009, pp. 2635-2639, American Institute of Physics.

Kim, Jihoon et al., "Understanding the base development mechanism of hydrogen silsesquioxane", Journal of Vacuum Science & Technology B: Microelectronics and Nanometer Structures Processing, Measurement, and Phenomena, 2009, pp. 2628-2634, American Institute of Physics, vol. 27, Issue 6.

Lee, Hyo-Sung et al., "Two-step resist-development process of hydrogen silsesquioxane for high-density alectron-beam nanopatterning", Journal of Vacuum Science & Technology B: Microelectronics and Nanometer Structures Processing, Measurement, and Phenomena, 2009, pp. 188-192, American Institute of Physics, vol. 27, Issue 1.

Stowers, Jason et al., "High resolution, high sensitivity inorganic resists", 2009, pp. 730-733, Microelectronic Engineering, vol. 86, Issues 4-6.

Koval, Y., "Mechanism of etching and surface relief development of PMMA under low-energy ion bombardment", Journal of Vacuum Science & Technology B: Microelectronics and Nanometer Struc-

(56) References Cited

OTHER PUBLICATIONS tures Processing, Measurement, and Phenomena, 2004, pp. 843-851, American Institute of Physics, vol. 22, Issue 2.

Bloomstein, T. M. et al., "Direct patterning of spin-on glass with 157nm lithography: Application to nanoscale crystal growth", Journal of Vacuum Science & Technology B: Microelectronics and Nanometer Structures Processing, Measurement, and Phenomena, 2005, pp. 2617-2623, American Institute of Physics, vol. 23, Issue 6.

Junarsa, Ivan et al., "Hydrogen silsesquioxane as a high resolution negative-tone resist for extreme ultraviolet lithography", Journal of Vacuum Science & Technology B: Microelectronics and Nanometer Structures Processing, Measurement, and Phenomena, 2005, pp. 138-143, American Institute of Physics, vol. 23, Issue 1.

Wachulak, P. W. et al., "Nanoscale patterning in high resolution HSQ photoresist by interferometric lithography with tabletop extreme ultraviolet lasers", Journal of Vacuum Science & Technology B: Microelectronics and Nanometer Structures Processing, Measurement, and Phenomena, 2007, pp. 2094-2097, American Institute of Physics, vol. 25, Issue 6.

Desai, Vishal et al., "Process development for high resolution hydrogen silsesquioxane patterning using a commercial scanner for extreme ultraviolet lithography", Journal of Vacuum Science & Technology B: Microelectronics and Nanometer Structures Processing, Measurement, and Phenomena B 35 (2), 2017, pp. 021603-021603-7, American Vacuum Society.

Yang; Ki-Yeon et al., "Novel fabrication technique for nanoscale hydrogen silsesquioxane structures using a direct printing technique", Journal of Vacuum Science & Technology, 2011, pp. 051602-051602-4, American Vacuum Society, vol. 29, issue 5.

Lauvernier, Denis et al., "Realization of sub-micron patterns on GaAs using a HSQ etching mask", Apr. 2005, pp. 210-216, Microelectronic Engineering, vol. 77, Issues 3-4.

Desai, Vishal et al., "Electron beam lithography patterned hydrogen silsesquioxane resist as a mandrel for self-aligned double patterning application"; Journal of Vacuum Science & Technology B 34 (6), Nov. 2016, pp. 061601-061601-6.

Gangnaik, Anushka S. eta al., "Novel germanium surface modification for sub-10 nm patterning with electron beam lithography and hydrogen silsesquioxane resist", Journal of Vacuum Science & Technology B 34, 2016, pp. 041603-041603-8.

Vila-Comamala, Joan et al., "Dense high aspect ratio hydrogen silsesquioxane nanostructures by 100 keV electron beam lithography", Nanotechnology, 2010, 6 pages, vol. 21, Issue 28.

Hamza, Bashar et al., "Direct fabrication of two-dimensional photonic crystal structures in silicon using positive and negative Hydrogen Silsesquioxane (HSQ) patterns", Microelectronic Engineering 91, Jan. 2011, pp. 70-74.

Hotovy, I. et al., "Patterning of titanium oxide nanostructures by electron-beam lithography combined with plasma etching", Journal of Micromechanics and Microengineering, Jun. 2015, 8 pages, vol. 25, Issue 7.

\* cited by examiner

900c

900d

METHOD OF FORMING A PATTERNED STRUCTURE AND DEVICE THEREOF

CROSS-REFERENCE TO RELATED APPLICATION

This application claims priority to Singapore Patent Application 10202006116P, which was filed on Jun. 25, 2020.

TECHNICAL FIELD

The present invention generally relates to a method of forming a patterned structure, and devices formed from the method.

BACKGROUND

Electron-beam lithography (EBL) is a form of maskless lithography widely used in nanofabrication due to its use in rapid prototyping and high resolution, such as having a sub-10 nm patterning capability. However, a patterning process employing EBL suffers from low throughput. During the exposure process of EBL, the designed patterns are written by scanning a focused beam across all the pixels in the targeted regions. For example, all the pixels within the boundary defining a desired pattern need to be scanned during the patterning process, which is inefficient particularly for patterns having a large area. For a specific class of geometries such as the large-area polygon structures, this scanning process is inefficient as the interior area would require sequential scanning by a tightly focused beam, resulting in long exposure times. For geometries with large area-to-perimeter ratio, the patterning time is dominated by the time it takes to "fill-in" the geometry by scanning a focused electron beam in an EBL system. Such geometries could be patterned quickly using a shaped-beam EBL or photolithography. Invariably, exposure of the filled area would exacerbate proximity effects that affect the critical dimensions of structures, result in rough edges, and rounded corners. These problems severely limit the use of EBL for high efficiency patterning such as that of a large area closed polygon structure with clear feature size at the boundary.

To tackle these problems, a process that makes use of outline-based patterning strategy known as "Sketch and Peel" lithography (SPL) was proposed for a reliable multi-scale metal patterning with enhanced patterning efficiency. In the process, only the outline of the patterns was defined by electron beam during the writing, thereby increasing the patterning efficiency significantly. However, the SPL process only works well for metals with weak surface adhesion such as gold, which limits its applications. Hence, common metals used for adhesion such as titanium and chromium are incompatible with the SPL process, which could lead to negative effects on the mechanical stability and electrical properties of the resultant structures.

A need therefore exists for a method of forming a patterned structure that seek to overcome, or at least ameliorate, the above-mentioned deficiencies in conventional patterning techniques. It is against this background that the present invention has been developed.

SUMMARY

According to a first aspect of the present invention, there is provided a method of forming a patterned structure on a substrate, comprising:

forming a resist layer on the substrate, the resist layer being a negative tone resist;

exposing a first portion of the resist layer to a focused electron beam to form a modified first portion, the modified first portion defining a boundary of a second portion of the resist layer;

performing a plasma treatment on a surface of the resist layer, including on a surface of the second portion of the resist layer to form a modified surface portion of the second portion of the resist layer, resulting in a plasma treated resist layer; and performing development of the plasma treated resist layer to form the patterned structure on the substrate corresponding the second portion of the resist layer.

According to a second aspect of the present invention, there is provided a device comprising a substrate and a patterned structure formed thereon formed by a method comprising:

forming a resist layer on the substrate, the resist layer being a negative tone resist;

exposing a first portion of the resist layer to a focused electron beam to form a modified first portion, the modified first portion defining a boundary of a second portion of the resist layer;

performing a plasma treatment on a surface of the resist layer, including on a surface of the second portion of the resist layer to form a modified surface portion of the second portion of the resist layer, resulting in a plasma treated resist layer; and performing development of the plasma treated resist layer to form the patterned structure on the substrate corresponding the second portion of the resist layer.

BRIEF DESCRIPTION OF THE DRAWINGS

Embodiments of the present invention will be better understood and readily apparent to one of ordinary skill in the art from the following written description, by way of example only, and in conjunction with the drawings, in which.

DETAILED DESCRIPTION

It will be appreciated by a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising", or the like such as "includes" and/or "including", when used in this specification, specify the presence of stated features, integers, steps, operations, elements, and/or components, but do not preclude the presence or addition of one or more other features, integers, steps, operations, elements, components, and/or groups thereof.

In order that the present invention may be readily understood and put into practical effect, various example embodiments of the present invention will be described hereinafter by way of examples only and not limitations. It will be appreciated by a person skilled in the art that the present invention may, however, be embodied in various different forms or configurations and should not be construed as limited to the example embodiments set forth hereinafter. Rather, these example embodiments are provided so that this disclosure will be thorough and complete, and will fully convey the scope of the present invention to those skilled in the art.

Further, any reference to an element or a feature herein using a designation such as "first," "second," and so forth does not limit the quantity or order of such elements or features. For example, such designations are used herein as a convenient method of distinguishing between two or more elements or instances of an element. Thus, a reference to first and second elements does not mean that only two elements can be employed, or that the first element must precede the second element. In addition, a phrase referring to "at least one of" a list of items refers to any single item therein or any combination of two or more items therein.

Various embodiments of the present invention provide a device comprising a substrate and a patterned structure formed thereon, and a method of forming thereof. According to various embodiments, a unique and novel integration of electron beam technology and plasma technology in resist patterning is provided.

Figure 1:
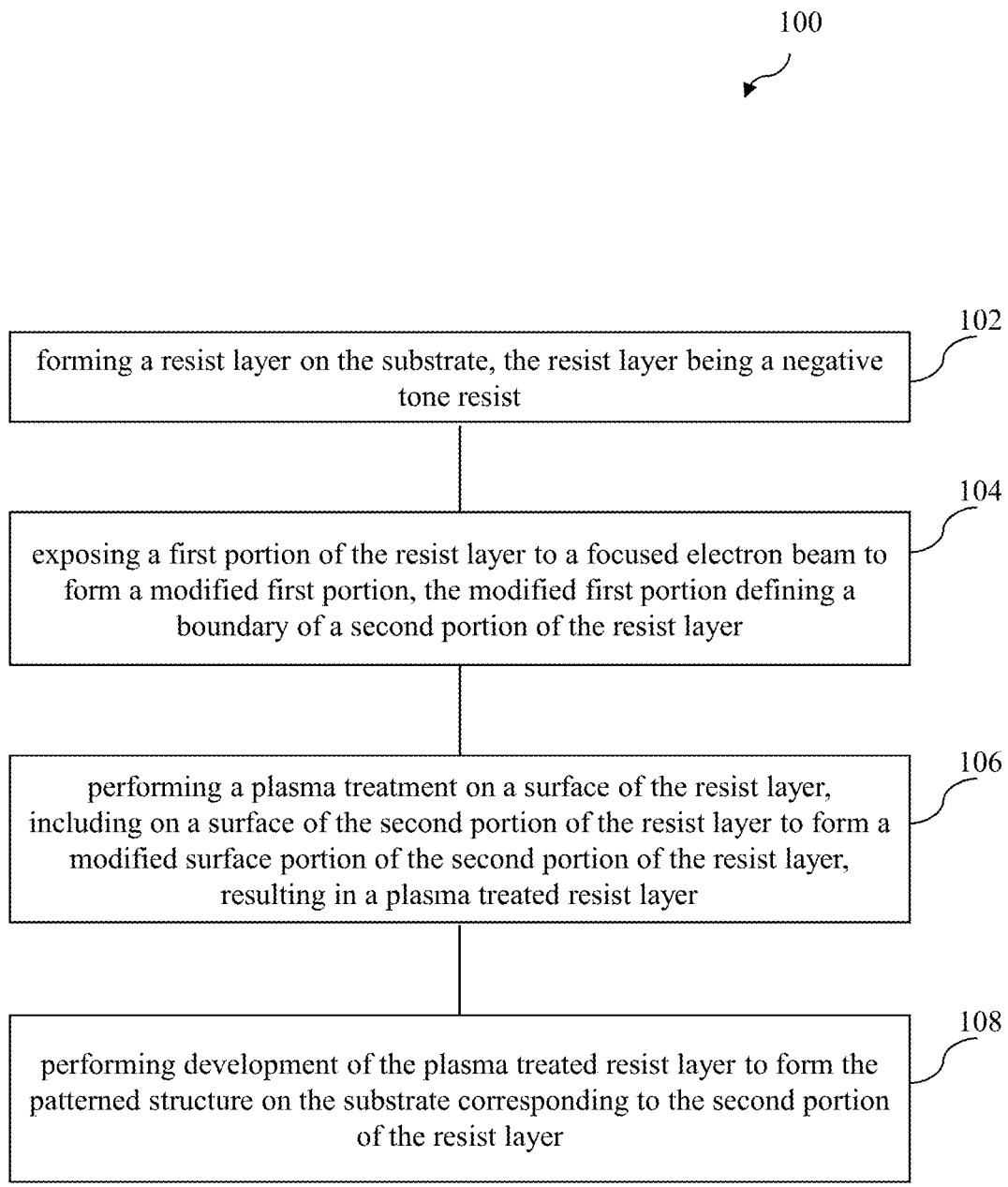
FIG. 1 depicts a schematic flow diagram of a method of forming a patterned structure on a substrate according to various embodiments of the present invention.

FIG. 1 depicts a schematic flow diagram of a method 100 of forming a patterned structure on a substrate according to various embodiments of the present invention. The method 100 comprises forming (at 102) a resist layer on the substrate, the resist layer being a negative tone resist; exposing (at 104) a first portion of the resist layer to a focused electron beam to form a modified first portion, the modified first portion defining a boundary of a second portion of the resist layer; performing (at 106) a plasma treatment on a surface of the resist layer, including on a surface of the second portion of the resist layer to form a modified surface portion of the second portion of the resist layer, resulting in a plasma treated resist layer; and performing (at 108) development of the plasma treated resist layer to form the patterned structure on the substrate corresponding the second portion of the resist layer.

In various embodiments, in relation to 102, the above-mentioned resist layer may be an inorganic resist. In other embodiments, the resist layer may be an organic resist.

In various embodiments, in relation to 104, the above-mentioned exposing a first portion of the resist layer to a focused electron beam to form a modified first portion may include using an electron beam lithography (EBL) system to scan the electron beam across the first portion such that the modified first portion is formed. In other words, electron beam writing may be performed across the first portion of the resist layer to form the modified first portion. The modified first portion may define or correspond to a boundary or perimeter or peripheral edge of the patterned structure to be formed on the substrate. For example, the modified first portion may correspond to the boundary or outline of a desired pattern formed in the resist layer.

In various embodiments, in relation to 106, the above-mentioned performing of a plasma treatment on a surface of the resist layer, including on a surface of the second portion of the resist layer, modifies a surface portion of the resist layer to form the modified surface portion of the second portion of the resist layer. In other words, the plasma treatment only modifies the surface of the resist layer to form the modified surface portion while leaving an underlying unmodified portion of the resist layer by the plasma treatment. The modified surface portion of the second portion of the resist layer may be a thin layer relative to the underlying unmodified portion of the resist layer. The modified surface portion of the second portion of the resist layer may be insoluble in a developer solution and may serve as a protective layer that blocks or prevents a developer solution from developing away unmodified portion (e.g., uncross-linked resist) within the modified first portion of the resist layer during development.

In various embodiments, in relation to 108, the above-mentioned performing development of the plasma treated resist layer to form the patterned structure on the substrate corresponding the second portion of the resist layer may include using a developer solution. The development may remove a portion of the resist layer unprotected by the modified first portion of the resist layer. In other words, the development may remove unexposed resist outside of the boundary of the pattern.

Accordingly, a plasma-assisted filling electron beam lithography (EBL) technique is provided to form patterned structures on the substrate. In the plasma-assisted EBL technique, the outline boundary of a targeted pattern on the resist is exposed during electron beam writing, without a need to expose an entire area corresponding to the targeted pattern on the resist. The resist layer may be subsequently treated with plasma treatment to form the modified surface portion of the second portion of the resist layer before development. The modified surface portion of the second portion of the resist layer may prevent uncross-linked resist within the modified first portion (e.g., patterned boundary) from being developed away, therefore realizing a polygon-filling mechanism for negative tone resist in the EBL process. In other words, the plasma treatment is used in place of a polygon-filling mechanism of conventional EBL on a resist. The plasma treatment may function as a "filling" tool for the patterning process and thus the method as described herein may be referred to as a Plasma-assisted Filling Technique (PFT). Further, the patterning method as described herein which employs the PFT and EBL may be referred to as a Plasma-assisted Filling Electron Beam Lithography (PFEBL).

As the outline of the patterns may be defined by the high-resolution electron-beam writing process, while the interior portions within the outline are defined by the fast plasma treatment process, the plasma-assisted EBL technique may advantageously increase the throughput of the patterning process significantly with a high resolution boundary, and particularly for direct writing lithography. Such patterning method may be useful to improve the speed of the patterning process particularly for patterned structures with large areas. For example, the patterning speed enhancement of 50 times and above may be achieved without affecting the boundary feature size and sub-10 nm resolution property of electron beam lithography.

The PFEBL technique as described may be used for a single step high-speed and high-resolution patterning of any large area closed polygon patterning by writing boundaries of the patterns during electron-beam writing process (without writing an entire area of each pattern), and therefore may have broad applications such as, but not limited to, photomask fabrication, nanophotonics, plasmonics and sensing devices. In various embodiments, the resist layer may form silicon oxide upon exposure and development, making it suitable as a dielectric and transparent material in electronic and optical devices. The plasma-assisted EBL according to various embodiments may be used for example to form patterned structures such as photonic waveguide structures and electrical contact pad structures.

In various embodiments, the negative tone resist layer may be formed of hydrogen silsesquioxane (HSQ), in a non-limiting example. For example, the resulting patterned resist from using HSQ may have a good etch resistance, high-resolution, and low line-edge roughness after development. Other types of negative tone resists, including inorganic resists such as hafnium sulfates and zirconium oxide sulfates, and organic resists, may also be used.

In various embodiments, the modified first portion and the modified surface portion of the second portion of the resist layer are crosslinked dense network (or dense-matrix) structures which together enclose an unmodified portion of the second portion of the resist layer on the substrate. For example, the plasma treatment may crosslink the surface portion of the resist layer to form a dense network structure, which protects the underlying unmodified portion of the second portion of the resist layer on the substrate during development.

In various embodiments, the modified first portion may have a loop configuration defining the boundary of the second portion of the resist layer. In various embodiments, the loop configuration may be a closed loop configuration. In various embodiments, the loop configuration may be a polygon configuration.

In various embodiments, the modified first portion may have a width of at least about 100 nm. The width of the modified first portion formed, for example, may depend on the area-to-width ratio of the patterned structure for a successful patterning process.

In various embodiments, the method may further comprise exposing a third portion of the of the resist layer to the focused electron beam prior to the plasma treatment to form a modified third portion within the modified first portion. The modified third portion may serve to support the modified surface portion of the second portion of the resist layer from breaking or collapsing during development, thereby increasing the yield of the patterning process (e.g., in the case of a modified first portion having a small boundary width).

In various embodiments, the plasma treatment may be an oxygen plasma treatment. The oxygen plasma treatment may be used as an oxidation tool to crosslink the surface of the resist layer resulting in the plasma treated resist layer. Different plasma chemistry may be used for different types of resists, such as organic and inorganic resists. For example, the oxygen plasma treatment may be used to crosslink the surface of the resist layer in the case an inorganic resist such as HSQ is used for the resist layer. In other embodiments, the plasma treatment may be an argon plasma treatment as a carbonization tool to crosslink the surface of the resist layer. For example, argon ion bombardment may be used to crosslink the surface of the resist layer, such as an organic resist. In other words, argon plasma treatment may be used in the case organic resists are used for the resist layer so as to induce carbonization on the top surface layer of the organic resist.

In various embodiments, the modified surface portion may be an oxidized layer. In other embodiments, the modified surface portion may be a carbonized layer.

In various embodiments, the method may further comprise performing an etch to remove residual modified surface portion external to the second portion of the resist layer. The etch may be a dry etch such as reactive ion etch, in a non-limiting example. For example, a fluorine-based chemical may be used for the etch.

In various embodiments, the method may further comprise fully crosslinking the patterned structure on the substrate into a dense network (or dense-matrix) structure by a thermal treatment (e.g., baking) prior to performing the etch. The thermal treatment may be performed at a temperature higher than the curing (or cross-linking) temperature of the resist (of the resist layer) used. For example, in the case HSQ resist is used to form the resist layer, the thermal treatment may be performed, using a hotplate in a non-limiting example, at a temperature of at least about 500° C. and duration of at least about one hour (e.g., two hours). Other baking techniques such as using an oven at longer or shorter curing time may also be used.

As described, the outline of the desired patterns may be exposed during the writing process and the full patterned structure may be obtained by incorporating post-exposure plasma treatment and development. The lithography patterning efficiency may be enhanced by 50 times and above while still being able to obtain sub-10 nm resolution patterning with sharp boundary feature size. Various embodiments provide a method for patterning large area closed polygon structures with high patterning efficiency, which may have various applications such as in nanophotonics and optoelectronics devices. In a non-limiting example, the patterned resist layer may be used as a dielectric material in electronic and optical devices and as an etch mask for pattern transfer of optical waveguides and electrical contact pads.

In particular, for better understanding of the present invention and without limitation or loss of generality, various example embodiments of the present invention will now be described with respect to patterning a resist layer formed of HSQ, however, it will be appreciated by a person skilled in the art that other types of negative tone resist may be used. Further, various embodiments may be described with respect to forming a patterned structure for illustration purpose, however it is understood that more than one patterned structure such as a plurality of patterned structures, including arrays of patterned structures may be formed.

Figure 2:
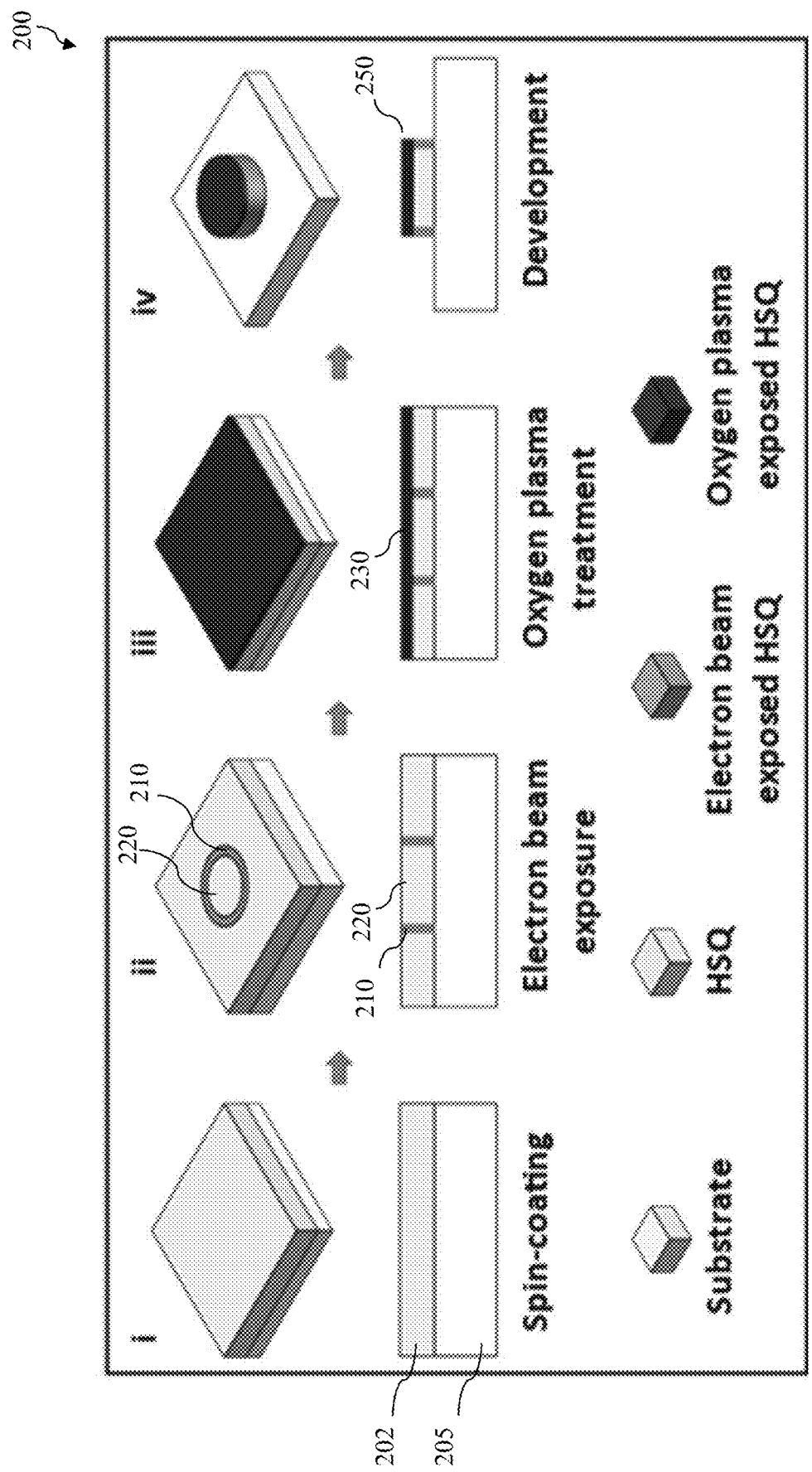
FIG. 2 illustrates an exemplary schematic of a method of forming a patterned structure on a substrate according to various embodiments of the present invention.

FIG. 2 illustrates an exemplary schematic of a method 200 of forming a patterned structure on a substrate according to various embodiments of the present invention. A resist layer 202 may be formed on the substrate or wafer 205. The substrate 205, for example, may be a semiconductor substrate such as silicon. In a non-limiting example, a HSQ resist (e.g., XR1541, 6%) may be spin coated on the substrate (e.g., at a rotational speed of about 5000 revolutions per minute (rpm) for a duration of about 1 minute) to form the resist layer 202. The resist layer 202 may have a thickness of about 100 nm. It is understood that the resist layer may be formed to have other thicknesses depending on application. In various example embodiments, no pre-baking is performed prior to the patterning process.

An electron beam exposure may be performed to expose a first portion of the resist layer 202. The exposure may be performed to form a modified first portion 210. The modified first portion 210 may define a boundary of a second portion 220 of the resist layer. For example, a boundary of a closed polygon structure to be formed may be defined by electron beam. In various example embodiments, the width of the boundary (or boundary width or pattern width) chosen to be written may be about 200 nm. Accordingly, the modified first portion 210 may be written or exposed to have a width of about 200 nm. However, it is understood that other widths for the modified first portion 210 may also be used. The electron beam exposure may be performed, for example, using Raith eLine Plus at 30 kV accelerating voltage and about 400 pA beam current. The electron exposure dose may be fixed at 1000 µC/cm$^2$, in a non-limiting example. Other electron exposure condition such as different exposure dose and/or different accelerating voltage may also be used depending on the properties of resists used such as thickness and chemical composition of the resist layer.

A plasma treatment, such as oxygen plasma treatment in a non-limiting example, may be performed on a surface of the resist layer 202, including on a surface of the second portion 220 of the resist layer to form a modified surface portion 230 of the second portion of the resist layer, resulting in a plasma treated resist layer. The modified surface portion 230 of the second portion of the resist layer may overlie an underlying unmodified portion of the second portion of the resist layer within the modified first portion 210. In various example embodiments, the modified surface portion 230, for example, may be an oxidized layer (also referred herein as an oxide membrane). In various example embodiments, the plasma treatment may be performed using the Advanced Vacuum Apex SLR ICP (e.g., inductively coupled plasma) with a plasma condition of about 150 W bias power, 10 mTorr, temperature of about 20° C. and gas (e.g., oxygen) flow rate of about 100 sccm, which provides a DC bias of about 450 V. The plasma treatment may be performed for a duration of about 2 minutes. The plasma condition, for example, may depend on the desired thickness of the modified surface portion 230. Different plasma conditions may form different thicknesses of the modified surface portion 230 (membrane).

The exposed and plasma treated resist pattern may be developed to form the patterned structure 250 on the substrate 205. The development process may be performed to selectively remove unexposed resist outside of the boundary of the pattern (i.e., removing a portion of the resist layer unprotected by the modified first portion 210 of the resist layer). For example, the development may be performed using a developer solution such as, but not limited to, a tetramethylammonium hydroxide (TMAH) 25% solution for a duration of about 4 minutes with ultrasonic agitation (e.g., 40 kHz) at room temperature (e.g., 25° C.), followed by rinsing under running deionized water for a duration of about 30 seconds and dipping in isopropyl alcohol (IPA) solution for a duration of about 10 seconds to stop the development process. Dipping in the IPA solution may also facilitate removal of residue from the development process. In other example embodiments, the developed resist or patterned structure may be dipped in a cleaning agent such as an acetone solution followed by the IPA solution. In yet other example, embodiments, the developed resist or patterned structure may be subjected to direct blow drying after rinsing in deionized water. For example, the patterned structure 250 on the substrate 205 may be blown dry in a steady stream of nitrogen ($N_2$) gas. In various example embodiments, the modified first portion defined by electron beam may be able to sustain the rigorous ultrasonic agitation during development process, and hence prevent the underlying resist from reacting with the developer solution.

In various example embodiments, residual oxide layer (residual modified surface portion) remaining on the substrate after development may be removed by an etch such as reactive ion etching (RIE). Before reactive ion etching, the patterned structure may be baked at a temperature higher than the curing temperature of the resist, such as a temperature of at least about 500° C. using a hotplate for a duration of about 2 hours to fully crosslink the patterned structure 250 on the substrate 205. The baking (thermal treatment) may be performed at a temperature higher than the curing temperature of the resist used for the resist layer. The duration of the baking, for example, may determine the quality of the crosslinking. For example, the longer the baking time, the better the crosslinking quality of the resist. In various example embodiments, a duration of at least about an hour may be performed using a hotplate. The duration may be different for different baking techniques, such as using an oven. Fully crosslinking the patterned structure 250 may prevent problems arising from inhomogeneous degrees of crosslinking within the patterned structure, which may manifest as different etch rates during reactive ion etching. The residual layer (residual modified surface portion) may then be etched away, for example, by using the Advanced Vacuum Apex SLR ICP (inductively coupled plasma) with etch condition of 15 W bias power, 600 W ICP power, 5 mTorr, 20° C. and 45 sccm of tetrafluoromethane ($CF_4$), which provides a DC bias of about 45 V. The patterned structure on the substrate may be etched for a duration of about 20 seconds to fully remove remaining residual layer (residual modified surface portion).

Scanning Electron Microscopy (SEM) and Optical Characterization

Optical microscopy and SEM may be used to investigate the fabricated nanostructures. For example, the optical image may be taken in reflection mode using an upright compound microscope (e.g., Nikon Eclipse LV100ND, Nikon Instruments Inc.). For example, a JEOL JSM 7600F SEM at 5 kV accelerating voltage and Raith eLine Plus at 10 kV accelerating voltage may be employed to take the SEM images.

Figure 3A:
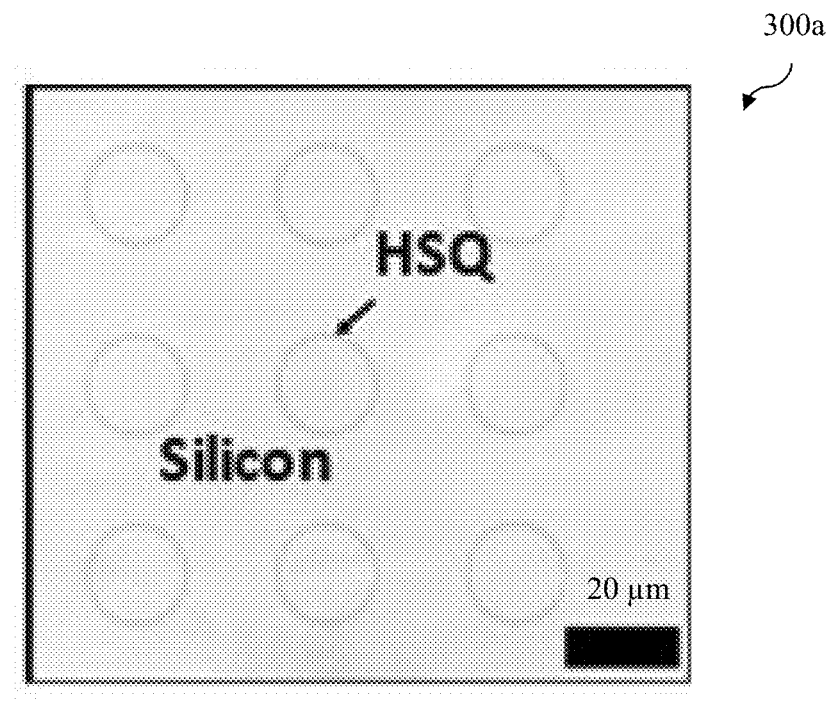
FIGS. 3A-3B illustrate optical microscope images of exemplary developed patterns of a patterned resist layer after development without and with post-electron beam exposure oxygen plasma treatment, respectively, according to various example embodiments of the present invention.
Figure 3B:
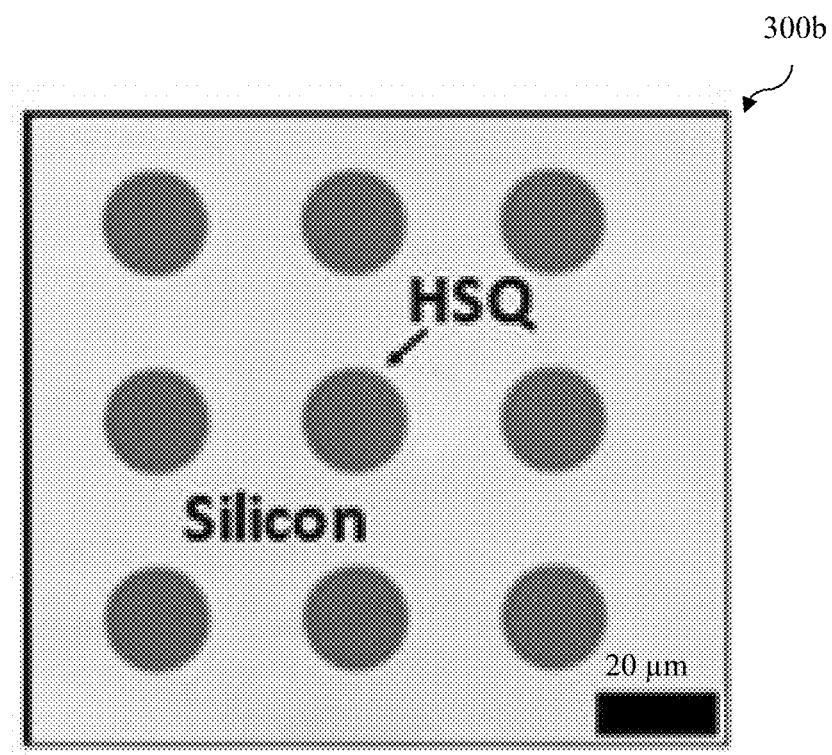

FIGS. 3A-3B illustrate optical microscope images 300a and 300b of exemplary developed patterns of a patterned resist layer after development without and with post-electron beam exposure oxygen plasma treatment, respectively, according to various example embodiments of the present invention. For the two images, same patterns of ring arrays were exposed during electron-beam writing. As illustrated in FIG. 3A, only modified first portions (e.g., exposed boundaries, the boundaries each having a ring configuration) of the patterned resist layer remain on the substrate after the development as a conventional EBL process was employed for the fabrication. As illustrated in FIG. 3B, patterned structures (e.g., polygon structures) of the patterned resist layer are formed on the substrate. Due to the protection of the modified surface portion (e.g., top oxide portion or membrane) formed during plasma treatment, the underlying unmodified portion or resist (e.g., unexposed to electron beam) within the boundary (modified first portion) may not react with the developer, and thus realizing a polygon-filling mechanism for a negative tone resist in the EBL process.

Figure 4A:
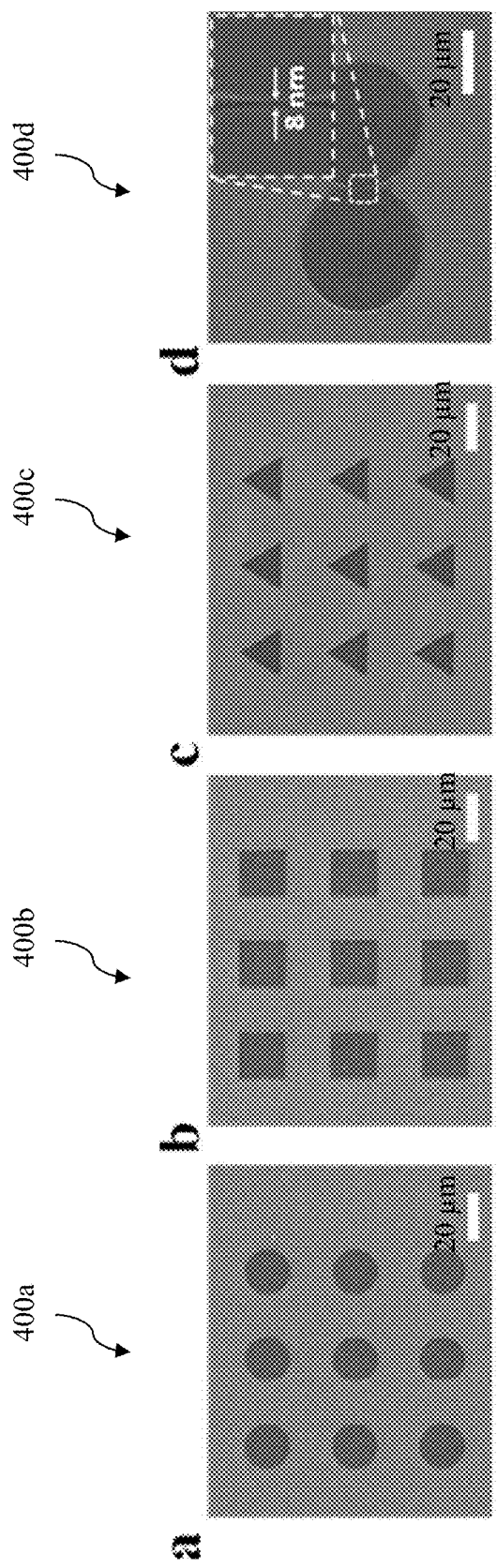
FIGS. 4A-4B illustrates exemplary SEM images of various patterns (patterned structures) fabricated according to various example embodiments of the present invention.
Figure 4B:
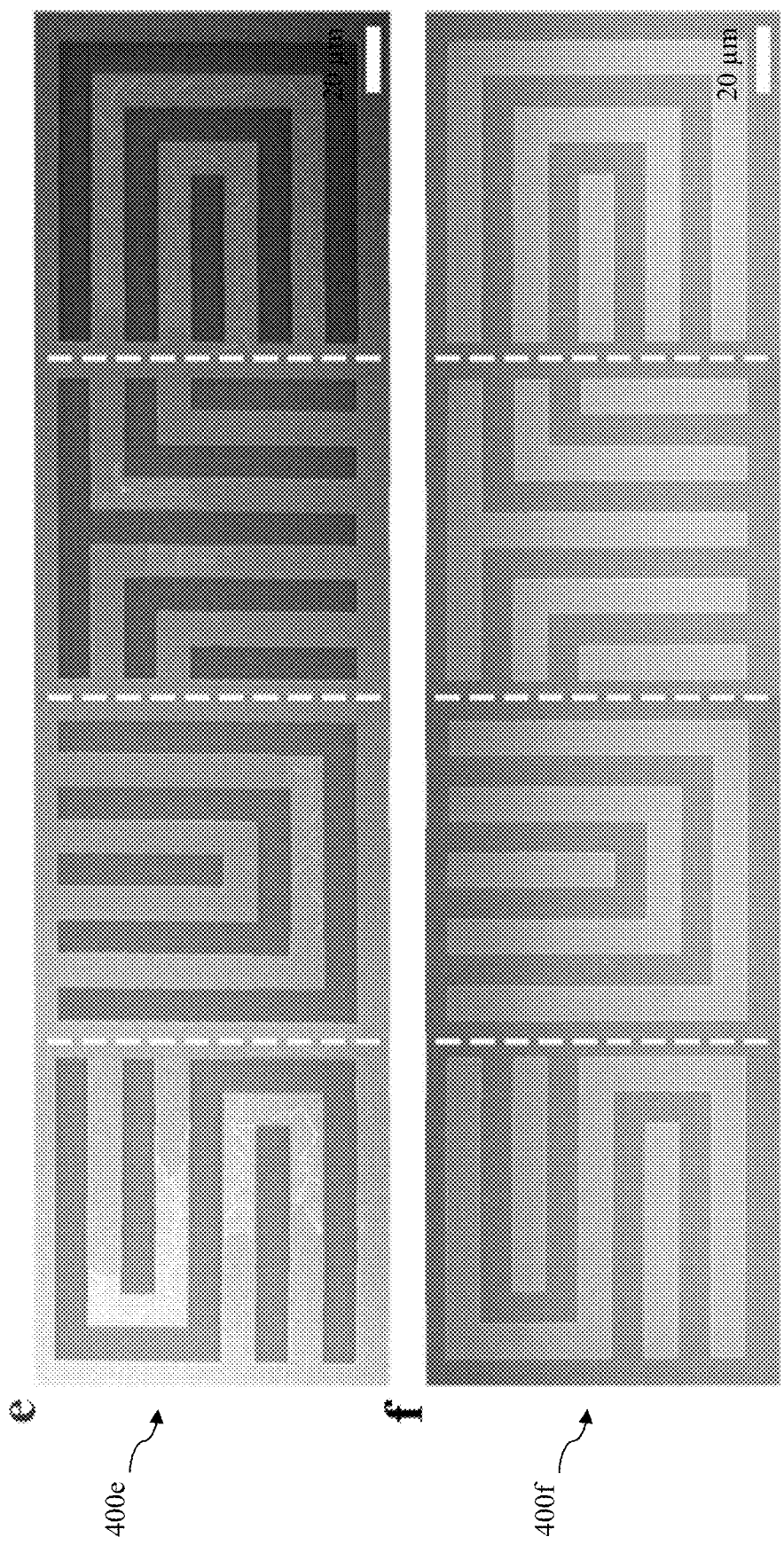

The PFEBL process may be used to pattern various shapes of structures. FIGS. 4A-4B illustrates exemplary SEM images of various patterns (patterned structures) fabricated using the PFEBL process according to various example embodiments of the present invention. The first modified portions for the patterned structures may be formed with a width of about 200 nm, in a non-limiting example. Referring to FIG. 4A, SEM images 400a, 400b, 400c and 400d illustrate an array of circle patterns, an array of square patterns, an array of triangle patterns, and a dimer of circle with gap of about 8 nm between the patterns, respectively. For example, image 400d further shows a zoom-in portion of a nanogap pattern having a gap of about 8 nm, indicating the feasibility for fabrication of ultra-small gaps between microscale geometries using the PFEBL process. For example, ultra-high resolution of about 8 nm may be achieved for patterns with over 100 $\mu m^2$ area without affecting the boundary feature size.

Referring to FIG. 4B, an SEM image 400e illustrates a stitched image of patterned structures forming the letters "S", "U", "T" and "D". The SEM image 400e illustrates the patterned structures on the substrate with residual oxide layer (residual modified surface portion). For example, brighter regions in between structures may be observed in the SEM image which may arise from the residual oxide layer. For example, the thickness of the residual oxide layer was measured by a surface profiler (e.g., Alpha-Step D-600 Stylus Profiler, KLA Tencor) to be about 20 nm. Such observation resembles the typical results from nanoimprint lithography where a residual layer also remains on the surface after the imprint process.

An SEM image 400f illustrates the same patterned structures on the substrate without residual oxide layer (i.e., after removing the residual oxide layer by an etching process). A clear contrast difference in the pattern color may be observed in images 400e and 400f due to the change of structure thickness after removal of residual oxide layer. For example, random residual oxide layers have been fully etched away. The PFEBL process may achieve sub-10 nm resolution patterning. Accordingly, various types of polygon patterns with different scales may be patterned at a high speed and high resolution with the PFEBL process.

Figure 5A:
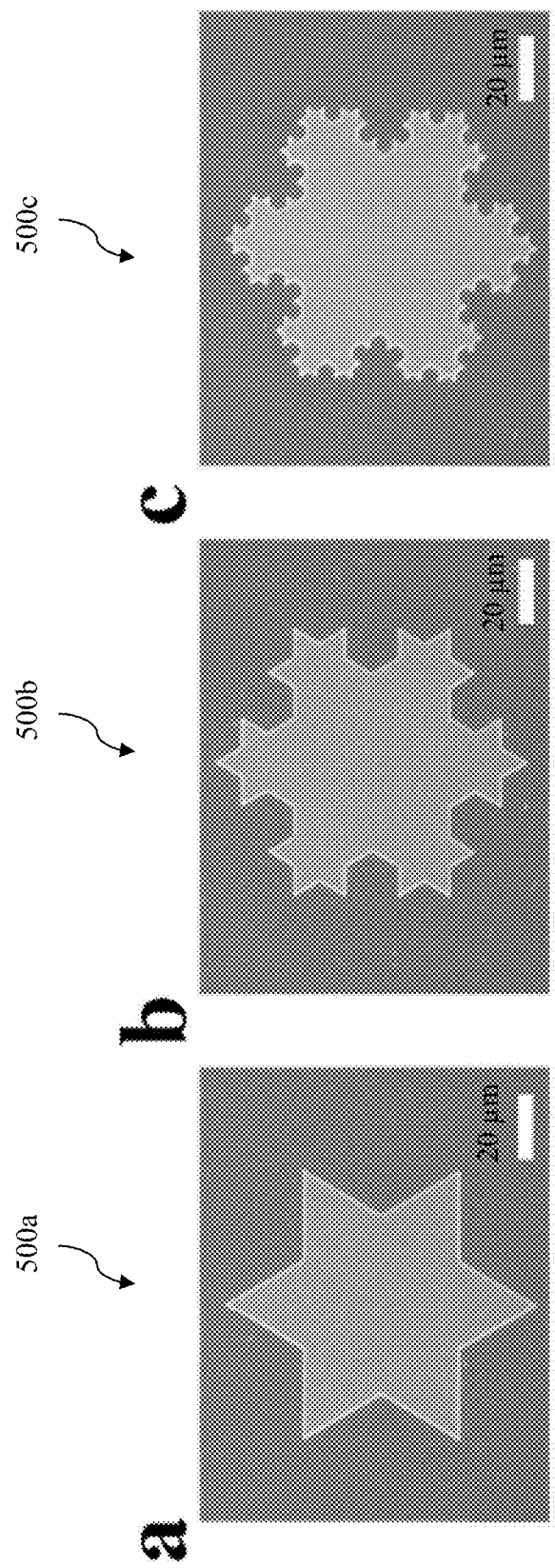
FIGS. 5A-5B show SEM images of the Koch snowflake fractal patterns fabricated according to various example embodiments of the present invention.
Figure 5B:
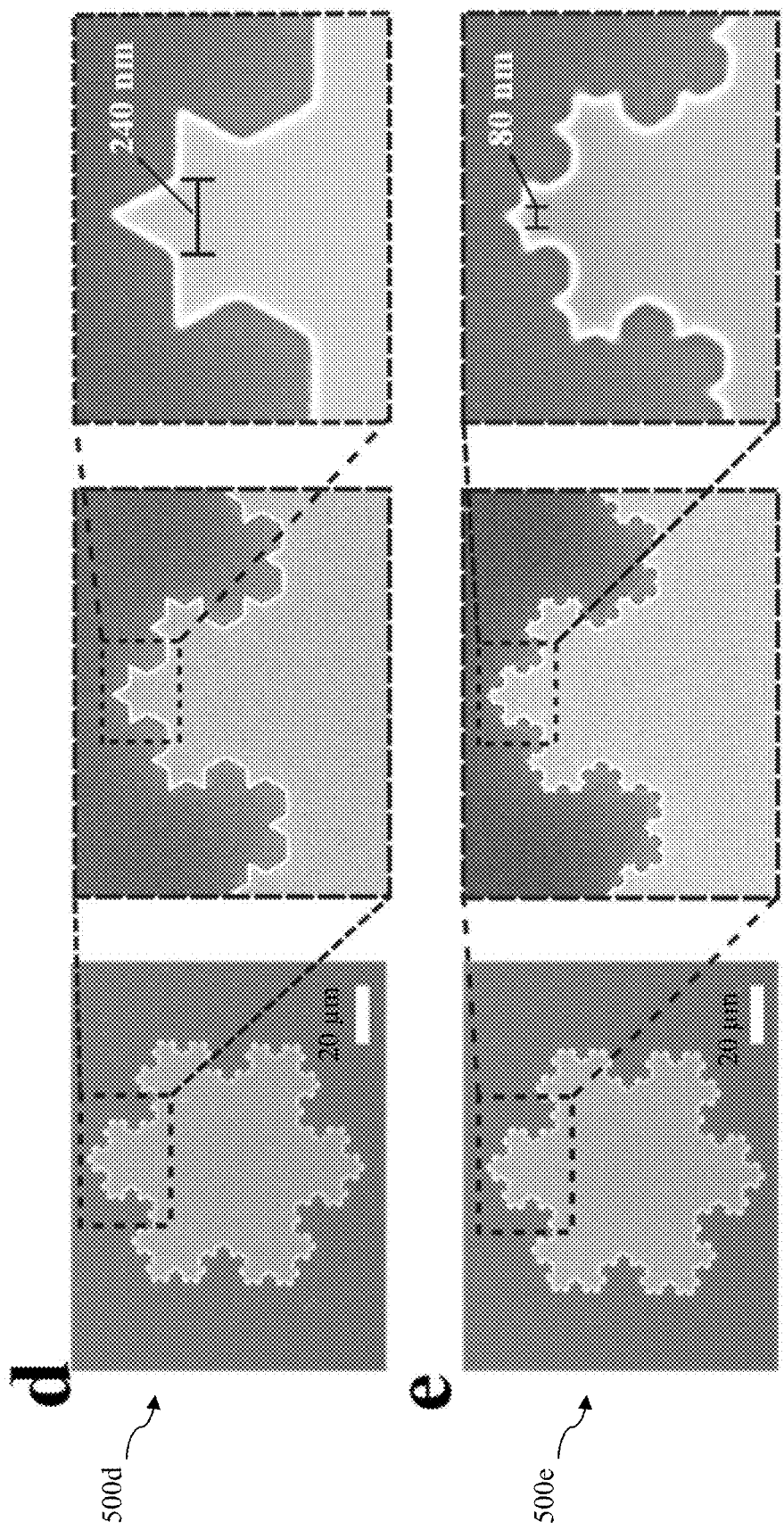

The influence of the exposed feature size at the boundary was investigated by patterning a series of Koch snowflake fractal patterns for order 1 to 5 using the PFEBL process. FIGS. 5A-5B show SEM images 500a-500e of the Koch snowflake fractal patterns fabricated using the PFEBL process according to various example embodiments of the present invention. For example, the Koch snowflake fractal patterns may be fabricated with a boundary width of 200 nm. The SEM images 500a-500c illustrate Koch snowflake fractal pattern for order 1 to 3, respectively; while SEM images 500d-500e illustrate Koch snowflake fractal pattern for order 4 and 5 with zoom-in images, respectively. The smallest feature size at the boundary achieved in the experiment is about 80 nm, as illustrated in image 500e. Moreover, it can be observed that no residual layers remain after the process and the sharp edges of the patterns may be obtained without defects, demonstrating the effectiveness of the PFEBL method in producing large area closed polygon structures with fine feature size at the boundary. In the experiment, higher order (e.g., 6 and 7) fractal geometry with feature size of 30 nm and 10 nm suffers from the proximity effect due to the boundary width required and limitation of the accelerating voltage (30 kV) available in the system. Proximity error correction (PEC) strategy may be required in the electron beam writing process for higher order fractal geometry. Hence, without employing PEC writing strategy, the highest order fractal geometry achieved is 5 in the study. It is noted, however, that one would already require PEC to pattern this geometry using the traditional approach, as the exposure required to fill in the pattern would significantly affect the small features on the perimeter. Accordingly, the PFEBL technique may improve throughput of the direct writing lithography for large area closed polygon structure significantly with high boundary resolution and zero stitching error.

Figure 6A:
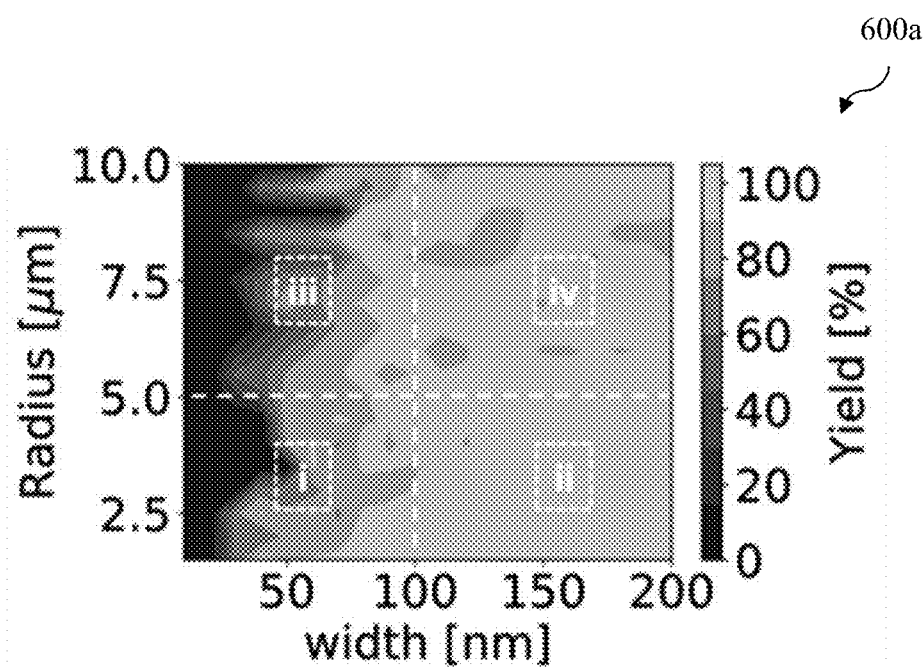
FIG. 6A shows a contour map of the yield for obtaining disk patterns after development for different disk radius and boundary width according to various example embodiments of the present invention.

To investigate the process window of the PFEBL process, a series of controlled experimental study was performed. In the study, a series of rings were written with varying boundary width from 30 nm to 200 nm and varying outer radius from 0.5 μm to 10 μm. The yield of the process was estimated through dividing the number of successfully patterned disk patterns by the total number (e.g., twenty-five) of the exposed patterns. FIG. 6A shows a contour map 600a of the yield for obtaining disk patterns after development for different disk radius and boundary width according to various example embodiments of the present invention. For example, the statistical plot illustrates the yield versus the disk radius and boundary width of the outline (first modified portion).

Yield Analysis for Patterns with Small Boundary Width (<100 nm) and Small Radius (<5 μm)

In various example embodiments, the yield decreases as the boundary width decreases. This result suggests that there may be a minimum value for the thickness of the boundary width to obtain a good yield for a given radius. The result is expected as the thin boundary wall (<100 nm) is unlikely to have enough mechanical strength to withstand the vibration of the oxide membrane (modified surface portion) during development.

Yield Analysis for Patterns with Large Boundary Width (>100 nm) and Small Radius (<5 μm)

In various example embodiments, near 100% yield was obtained which is expected as the large boundary width provide better mechanical support to the oxide membrane during development.

Yield Analysis for Patterns with Small Boundary Width (<100 nm) and Large Radius (>5 μm)

In various example embodiments, the yield shows a similar trend as the patterns with small boundary width (<100 nm) and small radius (<5 μm) where the yield decreases as the boundary width decreases. However, an interesting observation in this category is the apparent rippling in the yield when the radius increases. More experiments may be carried out in future study to investigate the nature of the effect.

Yield Analysis for Patterns with Large Boundary Width (>100 nm) and Large Radius (>5 μm)

In various example embodiments, the yield started to show more statistical variation as the support from the boundary likely could not withstand the vibration of the oxide membrane during development. Nevertheless, a yield as high as 80% may still be obtained at this parameter range.

Patterning Speed Enhancement Analysis

In various example embodiments, the patterning time enhancement of the PFEBL process according to various example embodiments of the present invention over normal EBL process may be analyzed as follows. For the analysis, the patterning time may be assumed to be proportional to the total area of the patterned structure, which implies that a constant exposure dose is used during the patterning process and the complexity of the patterns is assumed to have negligible influence on the patterning time. Based on the above assumption, the patterning time may therefore be transformed into a geometry calculation problem where the total area of written pattern for different writing strategy may be calculated to estimate the patterning time. To be consistent with the previous experimental analysis above, the geometries of the structures used for the calculation are a circle pattern and a ring pattern, which represents the writing strategies for normal EBL process and PFEBL process. The ratio of the area between these two patterns is provided as follows:

$$\text{Ratio} = \frac{\text{Area of a disk}}{\text{Area of a ring}} = \frac{\pi R^2}{\pi[R^2 - (R-w)^2]} = \frac{1}{1-\left(1-\frac{w}{R}\right)^2} \quad \text{Eqn (1)}$$

where R is the radius of the outer circle, and w is the boundary width.

Figure 6B:
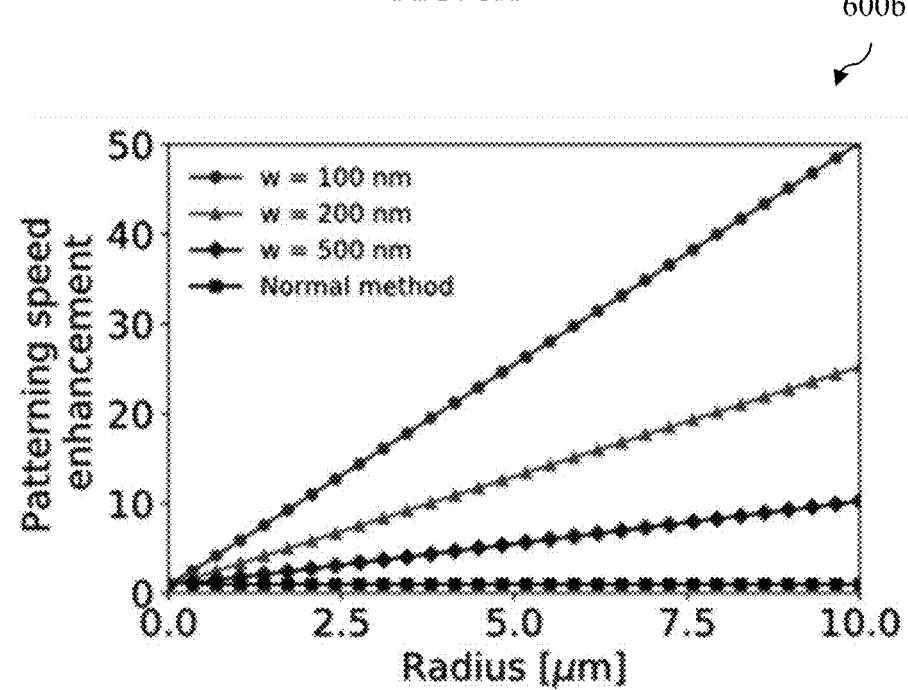
FIG. 6B shows a graph illustrating a patterning speed enhancement of a plasma-assisted filling electron beam lithography process versus different radius of ring patterns for different boundary width according to various example embodiments of the present invention.

The obtained results using Eqn (1) may be plotted as a function of radius, R for various boundary widths used. FIG. 6B shows a graph 600b illustrating a patterning speed enhancement of PFEBL process versus different radius of ring patterns for different boundary widths according to various example embodiments of the present invention. For example, graph 600b depicts the ratio of the patterning area which can also be represented as the patterning speed enhancement. A standard EBL process is included for comparison. Referring to FIG. 6B, the enhancement ratio for different boundary widths increases almost linearly with increasing radius and the gradient of linear enhancement increases with decreasing boundary width. This linear effect can be understood mathematically as the approximation when radius, R is much larger than the boundary width, w as follows: If R>>w, then $$\text{Ratio} = \frac{1}{1-\left(1-\frac{w}{R}\right)^2} \approx \frac{1}{1-\left(1-\frac{2w}{R}\right)} = \frac{R}{2w} \quad \text{Eqn (2)}$$

Accordingly, the enhancement of the patterning speed is generally inversely proportional to the boundary width while proportional to the size of the pattern. A remarkable improvement of the PFEBL process over conventional EBL process for large area closed polygon structures has been demonstrated. For instance, to obtain a disk pattern with radius of 10 μm, by using the PFEBL process, the electron-beam writing speed enhancement may increase up to 50-fold by choosing the boundary width to be 100 nm, thereby enhancing the patterning throughput significantly.

Figure 7A:
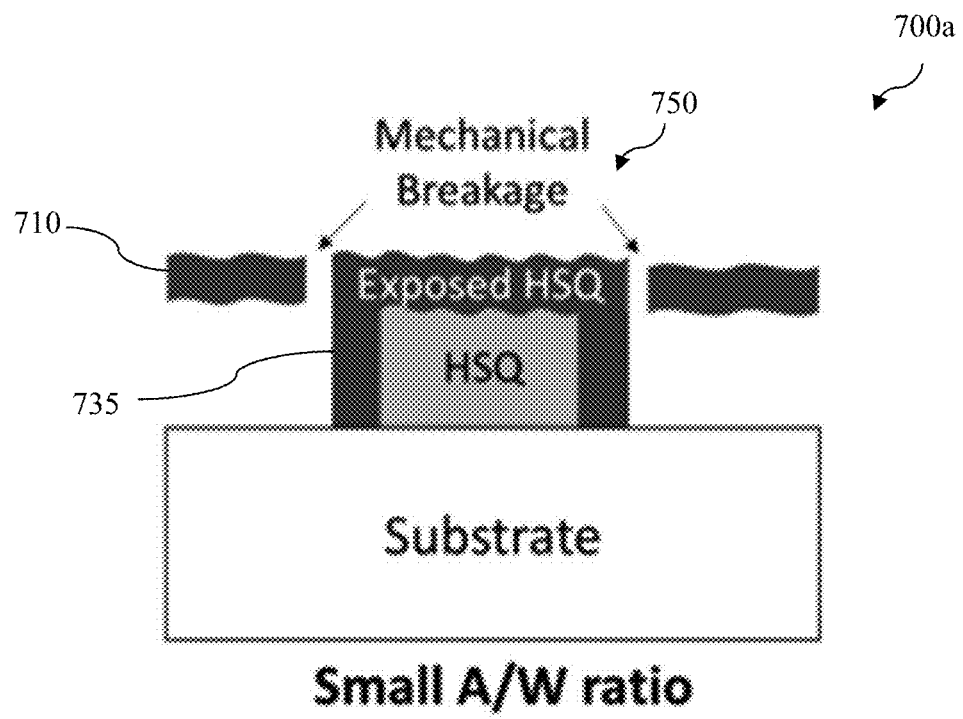
FIGS. 7A-7B illustrate schematic views of a structure during development process for patterns with small area to width ratio and patterns with large area to width ratio, respectively, according to various example embodiments of the present invention.
Figure 7B:
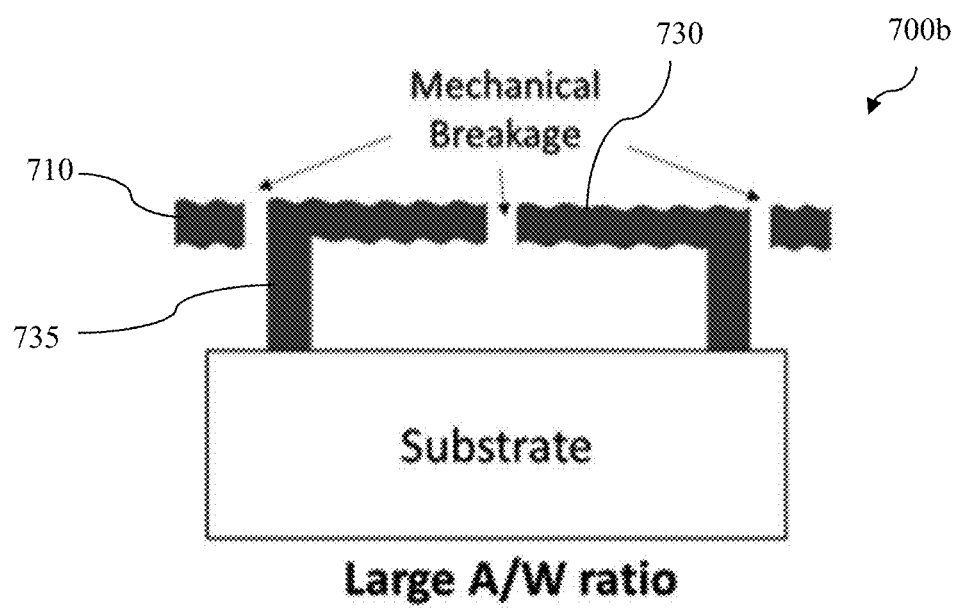

FIGS. 7A-7B illustrate schematic views 700a and 700b of a structure during development process for patterns with small area to width (A/W) ratio and patterns with large area to width (A/W) ratio, respectively. As illustrated in FIGS. 7A and 7B, a modified surface portion 710 of the resist layer not protected by the modified first portion 735 may be removed during development. For example, the modified surface portion 710 of the resist layer mechanically breaks off from the patterned structure 750. Referring to FIG. 7B, for patterns with very large area to width ratio, the modified surface portion 730 of the second portion of the resist layer may suffer from mechanical breakage. In such cases, the underlying unmodified portion of the second portion of the resist layer may be removed during development.

Figure 8:
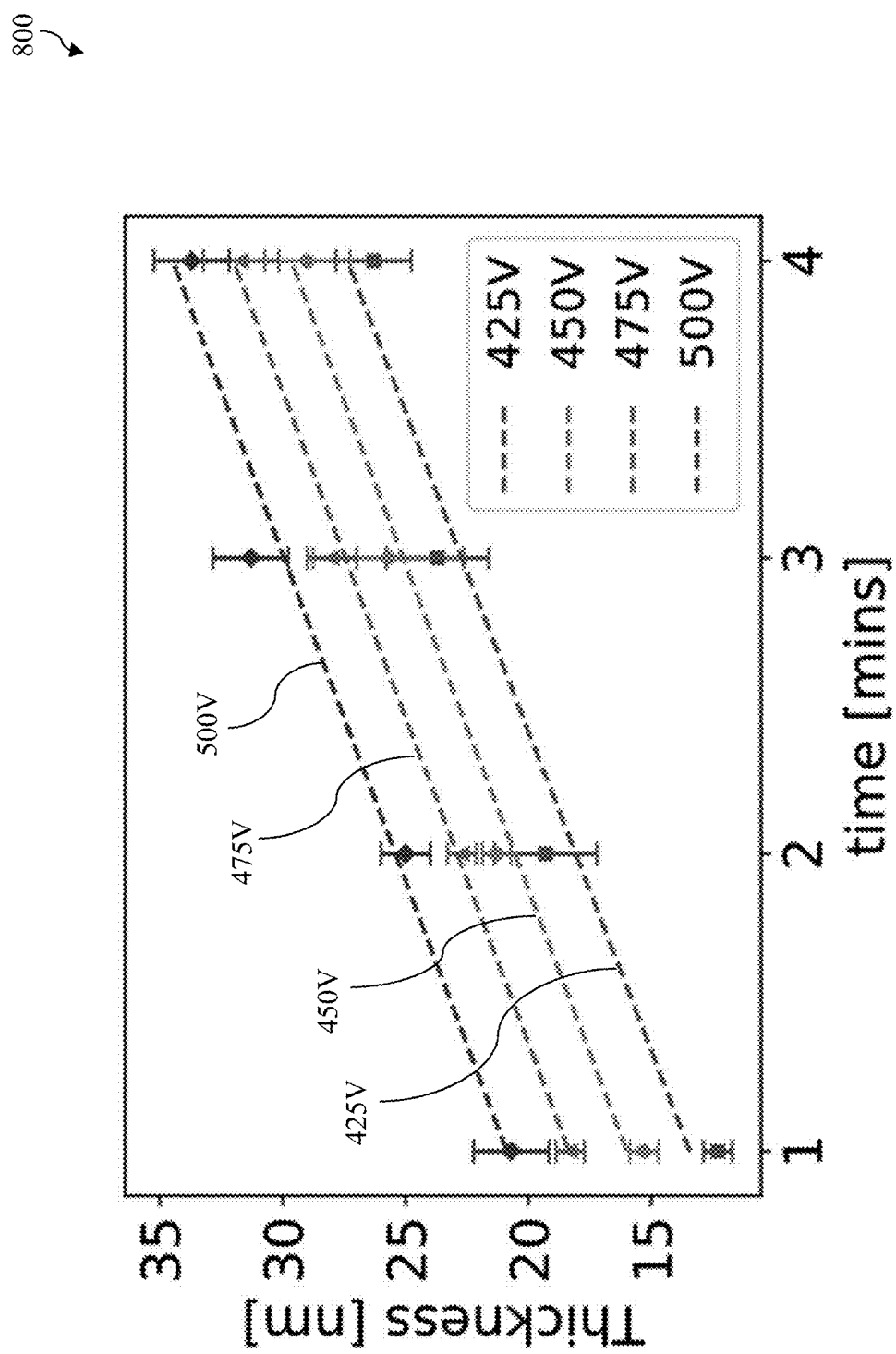
FIG. 8 shows a graph illustrating the thicknesses of residual oxide membrane for various plasma conditions and treatment time according to various example embodiments of the present invention.

To determine the thickness of plasma-crosslinked resist during the plasma treatment, the thickness of the residual oxide membrane was measured after development. The measurement was performed on the redeposited oxide membrane (residual modified surface portion) on the substrate that was unremoved and remain attached to the electron beam exposed resist structure (patterned structure). FIG. 8 shows a graph 800 illustrating the thicknesses of residual oxide membrane (residual modified surface portion) for various plasma conditions and treatment time. More particularly, the graph 800 shows the fitted-line plot of thicknesses of the residual oxide membrane measured by a surface profiler for various plasma treatment time and DC bias voltages. The thickness of the oxide membrane increases linearly with the treatment time at the rate of 4.5 nm/min. The rate of plasma-crosslinked resist was found to be consistent with all the DC bias voltage used which shows that the exposure mechanism of resist in plasma treatment is similar for all the plasma power tested. Furthermore, it is noted that the higher the DC bias voltage, the larger the thickness of the oxide membrane. This observation could be explained by larger initial penetration depth of oxygen ion into the resist due to higher DC bias voltage.

Mechanism Analysis

For example, when the resist (e.g., HSQ) is exposed to oxygen plasma, the cage-like structure of HSQ crosslinks into a dense network structure, similar to the cross-linking mechanism which occurs as in electron-beam irradiation and thermal curing. The exposure mechanism of HSQ in plasma treatment is believed to be based on two different processes: (i) physical energy transfer from oxygen ion bombardment, and (ii) oxidation by oxygen radicals. During the plasma process, the oxygen ions first bombard the resist layer or film and penetrate a finite depth into the film depending on the DC bias voltage used and treatment time. The physical energy transfer from oxygen ions to the HSQ film breaks the Si—H bond locally and cause the generation of dangling bonds. Then, the dangling bonds generated would be oxidized easily by reacting with the oxygen radical in the chamber or moisture from environment to form Si—OH bond.

A major difference in oxygen plasma treatment from electron-beam irradiation is that the speed of accelerating ions towards the resist layer is typically much lower. In EBL, accelerating voltage of kV scale may be used; however, in plasma process, hundreds of bias voltages are more commonly employed. Hence, the penetration depth of oxygen ions into HSQ film are much lower than electrons, which results in longer time for oxygen ions to crosslink the whole film compared to electron beams, as shown in FIG. 8. Furthermore, the size of oxygen ions is much larger than the electron. So, the penetration depth of the oxygen ions and crosslinking degree of the HSQ surface may be decreasing with time as the surface becomes denser in network-matrix as the treatment time increases. Therefore, instead of oxidizing the whole film, there may be a limited thickness of the oxidized (or oxide) layer formed during plasma treatment based on the plasma recipe used.

In various example embodiments, the range of plasma condition for the plasma treatment may depend on the capability of the equipment used and may depend on the required thickness of the modified surface portion. For example, different plasma conditions may form different thicknesses of the modified surface portion. In various example embodiments, the thickness of the modified surface portion may depend on the thickness of the resist layer used. For example, a higher thickness of the modified surface portion may be required for a resist layer. In various example embodiments, the plasma treatment may be performed for a duration of two minutes at high DC bias voltage (e.g., at about 450V at 150 W RF power and 10 mTorr pressure using Advanced Vacuum Apex SLR ICP). For example, in the case when the plasma treatment time further increases, a self-limiting process may occur where the oxide ions would not able to penetrate through the surface portion of the resist layer as the surface portion is crosslinked into a dense-matrix structure that acts like a barrier for ions to enter. As a result, there may not be any oxidation process occurring beyond a critical time. In various example embodiments, a higher DC bias voltage may produce thicker modified surface portion as the initial penetration of the ions (e.g., oxide ions) into the resist layer or film is deeper.

For the development process, the developer solution may function as a combination and a competition between crosslinking and dissolution process. For example, the TMAH 25% developer has been shown to facilitate forming an insoluble siloxane-like layer on the surface of the resist layer, which help strengthening the capability of the oxidized membrane as a protection layer during development.

In various example embodiments, the use of ultrasonic agitation during development may be effective to remove the residual oxide layer (residual modified surface portion) during development. The ultrasonic agitation of the solvent induces vibrations of the oxide membrane within the electron-beam exposed region (induces vibrations of the modified surface portion of the second portion of the resist layer). The electron-beam exposed regions may act as support frames for the vibration of the film. For patterns with small radius-to-width (R/w) ratio, the strain from the vibration of the membrane may be small enough such that the mechanical breakdown does not happen. However, for large R/w ratio, such as more than about 50 (5 μm/100 nm) in a non-limiting example, the vibration of the membrane may exceed the threshold limit at a certain time during development and cause the membrane to breakdown. If this case happens, the developer may react with the interior resist and develop resist away. This phenomenon explains the result of the relatively low yield of the process when the boundary width exposed by electron-beam is small (e.g., less than 100 nm). Nonetheless, to increase the yield of the process for small boundary width, additional structure may be patterned within the boundary by electron-beam, which increases the support of the thin film during development, thereby also increasing the yield of the process for small boundary width.

Figure 9A:
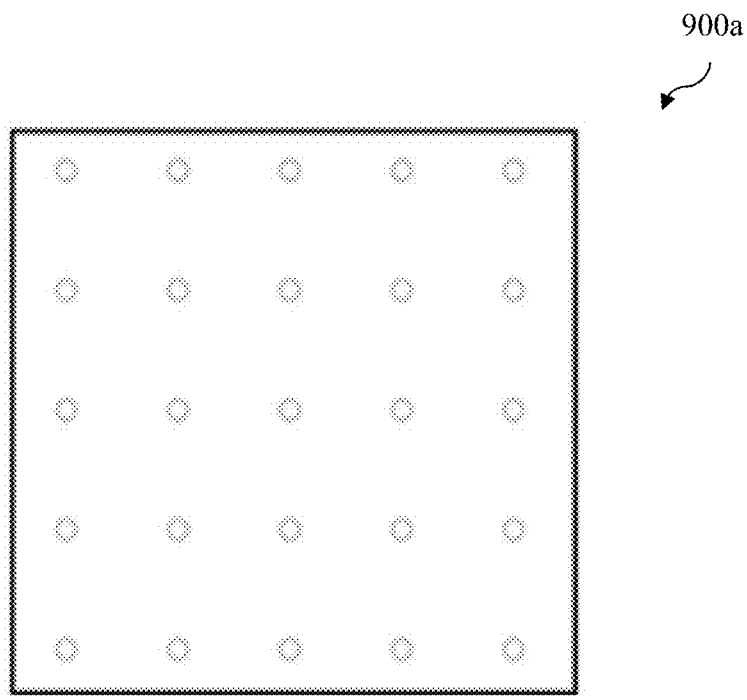
FIGS. 9A-9D show exemplary images illustrating an experimental method of the yield analysis according to various example embodiments of the present invention.
Figure 9B:
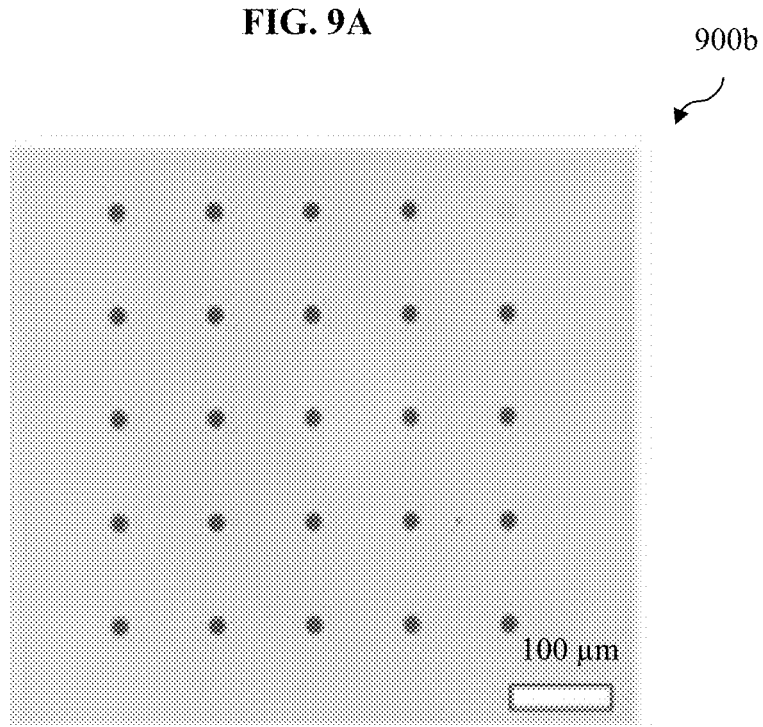
Figure 9C:
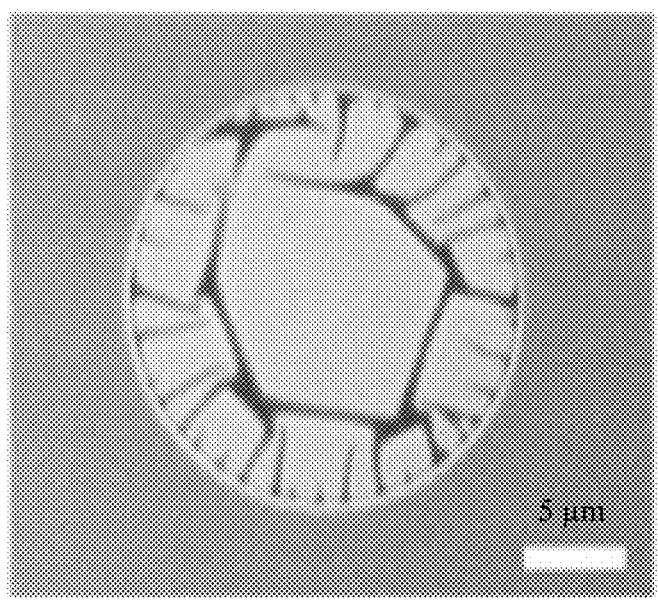
Figure 9D:
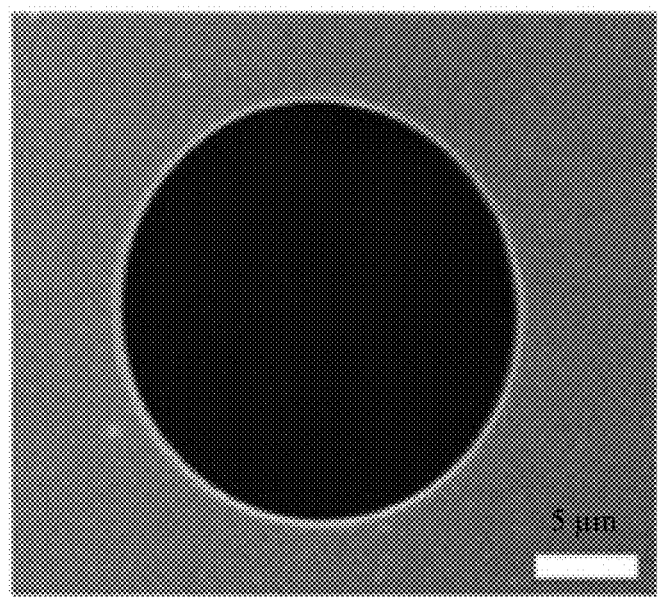

FIGS. 9A-9D show exemplary images 900*a-d* illustrating an experimental method of the yield analysis according to various example embodiments of the present invention. FIG. 9A illustrates a layout design for the EBL writing, while FIG. 9B illustrates an optical microscope image 900*b* of the test result for a given parameter set. FIG. 9C illustrates an SEM image 900*c* of an "incomplete" patterning with a broken modified surface portion, while FIG. 9D illustrates an SEM image 900*d* of a "complete" patterning with an unbroken modified surface portion.

Figure 10A:
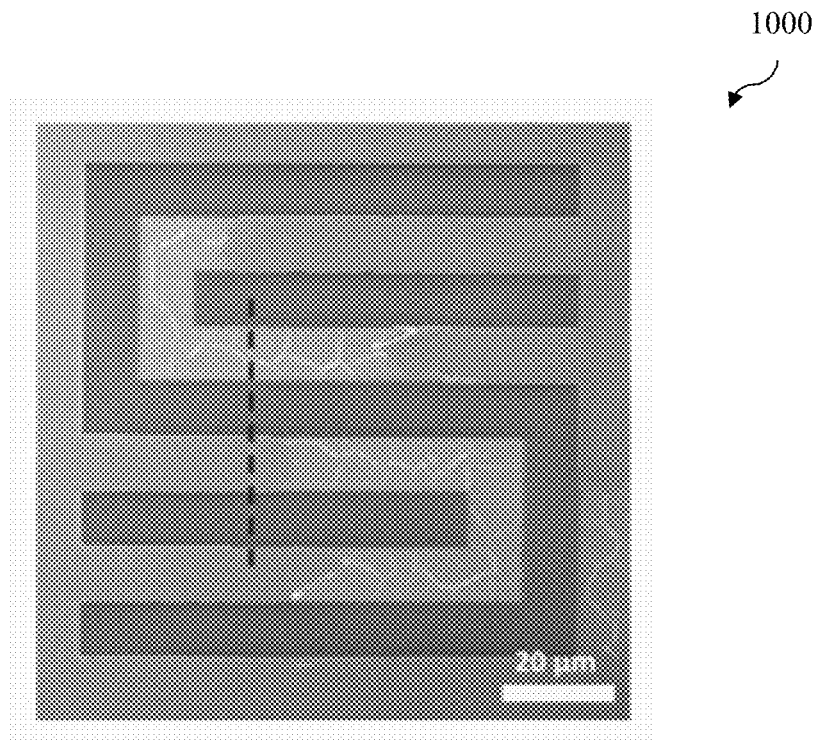
FIG. 10A shows an exemplary SEM image of a letter "S" fabricated according to various example embodiments of the present invention.
Figure 10B:
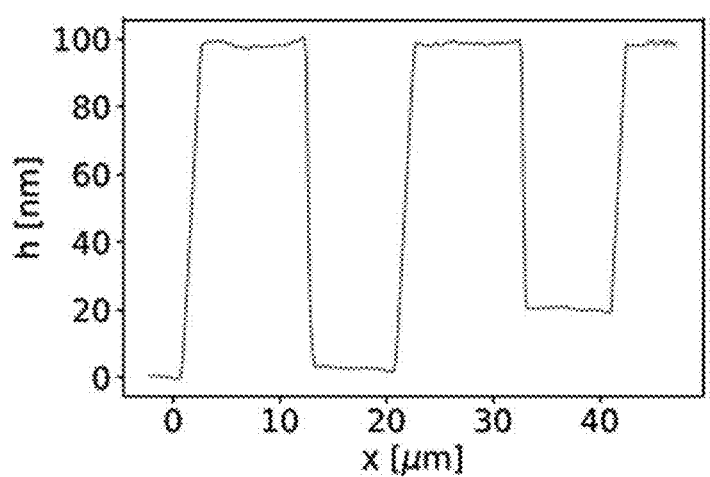
FIG. 10B shows an exemplary graph of a profiler measurement of the thickness of resist and residual oxide layer that remains on the surface after development according to various example embodiments of the present invention.

FIG. 10A shows an exemplary SEM image 1000 of an alphabet "S" fabricated according to various embodiments, while FIG. 10B shows an exemplary graph 1020 of a profiler measurement of the thickness of resist and residual oxide layer that remains on the surface after development. For example, the thickness of the HSQ resist is about 100 nm and the thickness of the residual oxide layer is estimated to be about 20 nm. This result provides an estimation of the thickness of the oxide membrane of HSQ (modified surface portion of the second portion of the resist layer) formed during plasma treatment.

Figure 11:
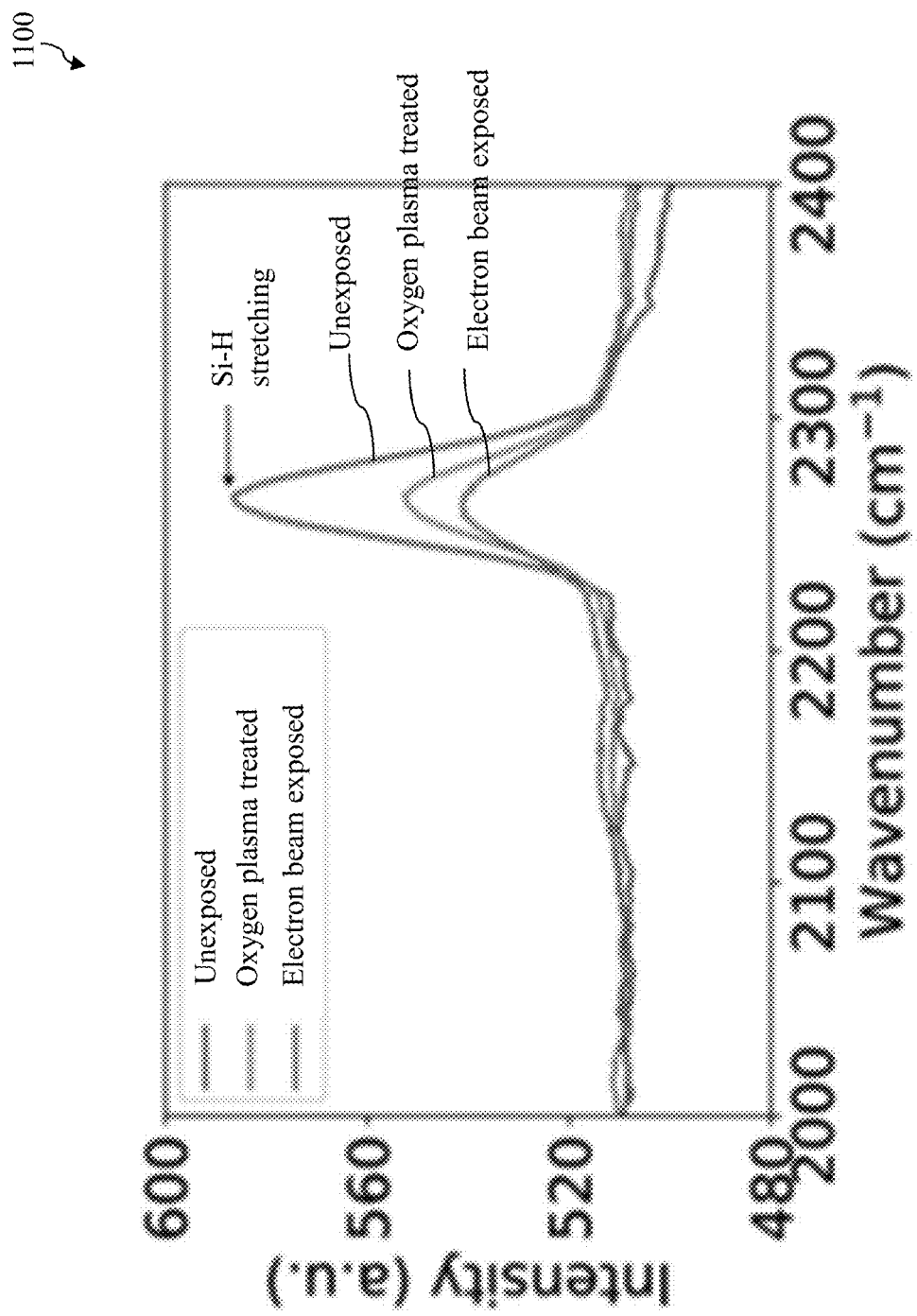
FIG. 11 shows a graph of a Raman spectra measurement for HSQ on silicon exposed to oxygen plasma and electron beam before development according to various example embodiments of the present invention.

FIG. 11 shows a graph 1100*a* of a Raman spectra measurement for HSQ on silicon exposed to oxygen plasma and electron beam before development in the 2000-2400 $cm^{-1}$ band. A fresh spin-coated HSQ on silicon was cleaved into two pieces, one exposed by electron beam and another one exposed by oxygen plasma. The untreated HSQ on silicon was included for comparison. The electron exposure dose for electron beam exposure is 1000 μC/cm2 using Raith eLine Plus at 30 kV accelerating voltage and about 400 pA beam current. The oxygen plasma condition used is 150 W bias power, 10 mTorr, 20° C., 100 sccm $O_2$, 2 minutes using Advanced Vacuum Apex SLR ICP. For both treatment processes, the Si—H peak shrinks after the exposure, suggesting a similar exposure mechanism happens in both cases. This result shows that the exposure mechanism for both electron beam and oxygen plasma on HSQ is similar and supports that oxygen plasma may be used as an integration tool for HSQ patterning.

While embodiments of the invention have been particularly shown and described with reference to specific embodiments, it should be understood by those skilled in the art that various changes in form and detail may be made therein without departing from the scope of the invention as defined by the appended claims. The scope of the invention is thus indicated by the appended claims and all changes which come within the meaning and range of equivalency of the claims are therefore intended to be embraced.

What is claimed is:

1. A method of forming a patterned structure on a substrate, the method comprising:
   forming a resist layer on the substrate, the resist layer being a negative tone resist;
   exposing a first portion of the resist layer to a focused electron beam to form a modified first portion, the modified first portion defining a boundary of a second portion of the resist layer;
   performing a plasma treatment on a surface of the resist layer, including on a surface of the second portion of the resist layer to form a modified surface portion of the second portion of the resist layer over an unmodified remaining portion of the second portion of the resist layer, resulting in a plasma treated resist surface layer comprising the modified surface portion of the second portion; and performing development using a developer solution with the modified surface portion being over the unmodified remaining portion of the second portion of the resist layer and the modified first portion surrounding the unmodified remaining portion of the second portion of the resist layer for protecting the unmodified remaining portion of the second portion of the resist layer from reacting with the developer solution for forming the patterned structure on the substrate comprising the unmodified remaining portion of the second portion of the resist layer.

2. The method of claim 1, wherein the modified first portion and the modified surface portion of the second portion of the resist layer are crosslinked dense network structures which together enclose the unmodified remaining portion of the second portion of the resist layer on the substrate.

3. The method of claim 2, wherein the modified first portion has a loop configuration defining the boundary of the second portion of the resist layer.

4. The method of claim 3, wherein the loop configuration is a closed loop configuration.

5. The method of claim 3, wherein the loop configuration is a polygon configuration.

6. The method of claim 1, wherein the modified first portion has a width of at least about 100 nm.

7. The method of claim 1, wherein the plasma treatment is an oxygen plasma treatment.

8. The method of claim 1, wherein the modified surface portion is an oxidized layer.

9. The method of claim 8, wherein the resist layer is formed of hydrogen silsesquioxane.

10. The method of claim 1, wherein the modified surface portion is a carbonized layer.

11. The method of claim 1, wherein said performing development of the plasma treated resist surface layer comprises removing an unmodified portion of the resist layer unprotected by the modified first portion and the modified surface portion of the second portion of the resist layer.

12. The method of claim 11, further comprising performing an etch to remove a residual of the modified surface portion over the unmodified remaining portion of the second portion of the resist layer.

13. The method of claim 12, further comprising fully crosslinking the unmodified remaining portion of the second portion of the resist layer on the substrate into a dense network structure by a thermal treatment prior to performing the etch.

14. The method of claim 1, wherein the plasma treatment is an argon plasma treatment.

15. The method according to claim 1, further comprising performing ultrasonic agitation of the substrate during said development for removing a residual portion of the plasma treated resist surface layer, wherein the modified first portion provides structural support to the modified surface portion of the second portion during said ultrasonic agitation of the substrate.

* * * * *